(12) United States Patent
Potkonjak et al.

(10) Patent No.: US 9,411,922 B2
(45) Date of Patent: Aug. 9, 2016

(54) YIELD OPTIMIZATION OF PROCESSOR WITH GRAPHENE-BASED TRANSISTORS

(71) Applicant: EMPIRE TECHNOLOGY DEVELOPMENT LLC, Wilmington (DE)

(72) Inventors: Miodrag Potkonjak, Los Angeles, CA (US); Saro Meguerdichian, West Hills, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/414,452

(22) PCT Filed: Aug. 15, 2013

(86) PCT No.: PCT/US2013/055024
§ 371 (c)(1),
(2) Date: Jan. 13, 2015

(87) PCT Pub. No.: WO2015/023276
PCT Pub. Date: Feb. 19, 2015

(65) Prior Publication Data
US 2015/0370943 A1     Dec. 24, 2015

(51) Int. Cl.
*G06F 17/50* (2006.01)
*H01L 29/16* (2006.01)
(Continued)

(52) U.S. Cl.
CPC ........ *G06F 17/5068* (2013.01); *G06F 17/5009* (2013.01); *H01L 27/0207* (2013.01); *H01L 29/1606* (2013.01); *H01L 29/66015* (2013.01)

(58) Field of Classification Search
CPC ............ G06F 17/5072; G06F 17/5068; G06F 17/5077; G06F 17/5045; G06F 2217/84; G06F 15/76; G06F 17/50; G06F 17/5054; G06F 17/5063; G06F 2217/08; G06F 2217/36; G06F 17/5009; G05B 2219/45031; G05B 19/41875; G03F 7/70525
USPC .................................. 716/100–106, 132–135
See application file for complete search history.

(56) References Cited

U.S. PATENT DOCUMENTS

| 8,450,779 B2 | 5/2013 | Guo et al. |
| 2004/0172603 A1* | 9/2004 | Collmeyer .............. G06F 17/50 716/139 |

(Continued)

FOREIGN PATENT DOCUMENTS

| TW | 201201340 A | 1/2012 |
| WO | 2012010934 A1 | 1/2012 |

OTHER PUBLICATIONS

Sergi Abadal et al., "Graphene-Enabled Hybrid Architectures for Multiprocessors: Bridging Nanophotonics and Nanoscale Wireless Communication", 14th International Conference on Transparent Optical Networks (ICTON), Jul. 2-5, 2012, pp. 4.

(Continued)

*Primary Examiner* — Binh Tat
(74) *Attorney, Agent, or Firm* — Ren-Sheng International

(57) ABSTRACT

Techniques described herein generally include methods and systems related to the selection of a combination of graphene and non-graphene transistors in an IC design. To reduce the increase in leakage energy caused by graphene transistors, selected non-graphene transistors may be replaced with graphene transistors in the IC design while other non-graphene transistors may be retained in the IC design. To limit the number of graphene transistors in the IC design, graphene transistors may replace non-graphene transistors primarily at locations in the IC design where significant delay benefit can be realized.

22 Claims, 6 Drawing Sheets

(51) Int. Cl.
 H01L 29/66 (2006.01)
 H01L 27/02 (2006.01)

(56) References Cited

U.S. PATENT DOCUMENTS

| | | | |
|---|---|---|---|
| 2005/0204316 A1* | 9/2005 | Nebel | G06F 17/5022 716/103 |
| 2005/0235232 A1* | 10/2005 | Papanikolaou | G06F 17/5045 700/33 |
| 2011/0067029 A1 | 3/2011 | Wolfe et al. | |
| 2011/0114919 A1 | 5/2011 | Jenkins et al. | |
| 2011/0191776 A1 | 8/2011 | Bose et al. | |
| 2011/0296368 A1 | 12/2011 | Reis et al. | |
| 2012/0074387 A1 | 3/2012 | King | |
| 2012/0181508 A1 | 7/2012 | Chang et al. | |
| 2012/0181510 A1 | 7/2012 | Avouris et al. | |

OTHER PUBLICATIONS

Asenasenov, "Random Dopant Induced Threshold Voltage Lowering and Fluctuations in Sub-0.1 µm MOSFET's: A 3-D "Atomistic" Simulation Study", IEEE Transactions on Electron Devices, Dec. 1998, pp. 2505-2513, vol. 45, No. 12.
Phaedon Avouris, "Graphene: Electronic and Photonic Properties and Devices", Nano Letters, 2010, pp. 4285-4294, vol. 10, Issue 11.
Giuseppe C. Calafiore et al., "The Scenario Approach to Robust Control Design", IEEE Transactions on Automatic Control, May 2006, pp. 742-753, vol. 51, No. 5.
Eylon Caspi et al., "Stream Computations Organized for Reconfigurable Execution (SCORE) : Introduction and Tutorial", Version 1, Aug. 25, 2000.
B. Cheng et al., "Evaluation of Statistical Variability in 32 and 22 nm Technology Generation LSTP MOSFETs", Solid-State Electronics, 2009, pp. 767-772 , vol. 53.
Brian Cline et al., "Analysis and Modeling of CD Variation for Statistical Static Timing", IEEE/ACM International Conference on Computer-Aided Design, ICCAD '06, Nov. 5-9, 2006, pp. 60-66.
Andre Dehon et al., "Nanowire-Based Sublithographic Programmable Logic Arrays", In Proceedings of the 2004 ACM/SIGDA 12th international symposium on Field programmable gate arrays (FPGA '04), Feb. 22, 2004, pp. 123-132.
Steven G. Duvall, "Statistical Circuit Modeling and Optimization", 2000 5th International Workshop, 2000, pp. 56-63.
Gianluca Fiori et al., "Multiscale Modeling for Graphene-Based Nanoscale Transistors", Proceedings of the IEEE, Jul. 2013, pp. 1653-1669, vol. 101, No. 7.
Stephen Friedman et al., "SPR: An Architecture-Adaptive CGRA Mapping Tool", In Proceedings of FPGA, Feb. 22-24, 2009, pp. 191-200.
A. K. Geim, "Graphene: Status and Prospects", Science, Jun. 19, 2009, pp. 1530-1534, vol. 324.
A. K. Geim et al., "The Rise of Graphene", Nature Materials, Mar. 2007, pp. 183-191, vol. 6.
Benjamin Gojman et al., "3D Nanowire-Based Programmable Logic", Appearing in International Conference on Nano-Networks, Sep. 14-16, 2006, pp. 5.
Seth Copen Goldstein et al., "NanoFabrics: Spatial Computing Using Molecular Electronics", in Proceedings of the 28th Annual International Symposium on Computer Architecture, Jun. 2001, pp. 178-189.
Tom R. Halfhill, "Tabula's Time Machine", Microprocessor Report, Mar. 29, 2010-01, pp. 14.
Pat Hanrahan, "Domain-Specific Languages for Heterogeneous Computing Platforms", Parallel @ Illinois DLS, Apr. 15, 2010, pp. 30.
Inki Hong et al., "Power Optimization of Variable-Voltage Core-Based Systems", IEEE Transactions On Computer-Aided Aided Design of Integrated Circuits and Systems, Dec. 1999, pp. 1702-1714, vol. 18, No. 12.

International Search Report and Written Opinion of the International Searching Authority, International application No. PCT/US2013/055025, Oct. 8, 2013.
International Search Report and Written Opinion of the International Searching Authority, International application No. PCT/US2013/055024, Oct. 30, 2013.
D. Jones et al., "A Time-Multiplexed FPGA Architecture for Logic Emulation", Proceedings of the IEEE on Custom Integrated Circuits Conference, May 1-4, 1995, pp. 495-498.
Santosh Khasanvis et al., "Hybrid Graphene Nanoribbon-CMOS Tunneling Volatile Memory Fabric", IEEE/ACM International Symposium on Nanoscale Architectures (NANOARCH), Jun. 8-9, 2011, pp. 189-195.
Darko Kirovski et al., "System-Level Synthesis of Low-Power Hard Real-Time Systems", in Proceedings of the 34th Design Automation Conference, Jul. 9-13, 1997, pp. 697-702.
Darko Virovski et al., "Synthesis of Power Efficient Systems-on-Silicon", Design Automation Conference 1998. Proceedings of the ASP-DAC '98. Asia and South Pacific, Feb. 10-13, 1998, pp. 557-562.
Dejan Markovic et al., "Ultralow-Power Design in Near-Threshold Region", Proceedings of the IEEE, Feb. 2010, pp. 237-252, vol. 98, No. 2.
Arkadi Memirovski et al., "Convex Approximations of Change Constrained Programs", SIAM J. Optim., 2006, pp. 969-996, vol. 17, No. 4, Society for Industrial and Applied Mathematics.
Miodrag Potkonjak et al., "Algorithm Selection: A Quantitative Optimization-Intensive Approach," IEEE Transactions on Computer-Aided Design of Integrated Circuits and Systems, May 1999, pp. 524-532, vol. 18, No. 5.
Miodrag Potkonjak et al., "Power Minimization in DSP Application Specific Systems Using Algorithm Selection", International Conference on Acoustics, Speech, and Signal Processing (ICASSP-95), May 9-12, 1995, pp. 2639-2642, vol. 4.
Smruti R. Sarangi et al., "VARIUS: A Model of Process Variation and Resulting Timing Errors for Microarchitects", IEEE Transactions on Semiconductor Manufacturing, Feb. 2008, pp. 3-13, vol. 21, No. 1.
Stephen M. Scalera, "The Design and Implementation of a Context Switching FPGA", in Proceedings of IEEE Symposium on Field-Programmable Custom Computing Machines, Apr. 15-17, 1998, pp. 78-85.
Frank Schwierz, "Industry-Compatible Graphene Transistors", Nature, Apr. 7, 2011, pp. 41-42 , vol. 472.
Dmitri B Struckov et al., "CMOL FPGA: A Reconfigurable Architecture for Hybrid Digital Circuits with Two-Terminal Nanodevices", Nanotechnology, Apr. 19, 2005, pp. 888-900, vol. 16, Institute of Physics Publishing.
Sansiri Tanachutiwat et al., "Reconfigurable Multi-Function Logic Based on Graphene P-N Junctions", DAC'10, Jun. 13-18, 2010, pp. 883-888.
Steve Trimberger et al., "A Time-Multiplexed FPGA", Field-Programmable Custom Computing Machines, in Proceedings of the 5th Annual IEEE Symposium, Apr. 16-18, 1997, pp. 22-28.
D. Tu et al., "Three-Dimensional CMOL: Three-Dimensional Integration of CMOS/Nanomaterial Hybrid Digital Circuits", Micro & Nano Letters, Jun. 2007, pp. 40-45, vol. 2, Issue 2.
Alireza Vahdatpour et al., "Leakage Minimization Using Self Sensing and Thermal Management", ACM/IEEE International Symposium on Low-Power Electronics and Design (ISLPED), Aug. 18-20, 2010, pp. 265-270.
Rafael Vargas-Bernal et al., "Carbon Nanotube- and Graphene Based Devices, Circuits and Sensors for VLSI Design", In VLSI Design Chapter 3, Jan. 2012, pp. 41-66.
Andy Ye et al.,"Using Bus-Based Connections to Improve Field-Programmable Gate-Array Density for Implementing Datapath Circuits", IEEE Transactions on Very Large Scale Integration (VLSI) Systems, May 2006, pp. 462-473, vol. 14, No. 5.
Wei Zhang et al., "Low-Power 3D Nano/CMOS Hybrid Dynamically Reconfigurable Architecture", ACM Journal on Emerging Technologies in Computing Systems, Aug. 2010, pp. 32, vol. 6, No. 3, Article 10.

(56) References Cited

OTHER PUBLICATIONS

Wei Zhang et al., "NATURE: A Hybrid Nanotube/CMOS Dynamically Reconfigurable Architecture", In Proceedings of the 43rd annual Design Automation Conference (DAC '06), Jul. 24-28, 2006, pp. 711-716.

Monolithically-Integrated Graphene Structures as Sensors, Harvard University Office of Technology Development, accessed on Oct. 20, 2015 at <URL:http://web.archive.org/web/20120417140700/http://www.techtransfer.harvard.edu/technologies/tech.php?case=3844>.

Miguel R. Corazao et al., "Performance Optimization Using Template Mapping for Datapath-Intensive High-Level Synthesis", IEEE Transactions on Computer-aided Design of Integrated Circuits and Systems, Aug. 1996, pp. 877-888, vol. 15, No. 8.

Olivier Coudert, "Gate Sizing for Constrained Delay/ Power/ Area Optimization", IEEE Transactions on very large scale integration systems, Sep. 1997.

Inki Hong et al., "On-Line Scheduling of Hard Real-Time Tasks on Variable Voltage Processor", 1998 IEEE/ACM International conference on Computer-aided design, Nov. 1, 1998, pp. 653-656.

Inki Hong et al., "Synthesis Techniques for Low-Power Hard Real-Time Systems on Variable Voltage Processors", Proceedings of 19th IEEE Real-Time System Symposium, Dec. 2-4, 1998, pp. 178-187.

Miodrag Potkonjak et al., "Behavioral Optimization Using the Manipulation of Timing Constraints", IEEE Transactions on Computer-Aided Design of Integrated Circuits and Systems, Oct. 1998, pp. 936-947, vol. 17, No. 10.

James W. Tschanz et al., "Adaptive Body Bias for Reducing Impacts of Die-to-Die and Within-Die Parameter Variations on Microprocessor Frequency and Leakage", IEEE Journal of Solid-State Circuits, Nov. 2002, pp. 1396-1402, vol. 37, No. 11.

Kimiyoshi Usami et al., "Automated Low-Power Technique Exploiting Multiple Supply Voltages Applied to a Media Processor", IEEE Journal of Solid-State Circuits, Mar. 1998, pp. 463-472, vol. 33, No. 3.

Qing Wu et al., "Clock-Gating and Its Application to Low Power Design of Sequential Circuits", IEEE Transactions on Circuits and Systems I: Fundamental Theory and Applications, Mar. 2000, pp. 415-420, vol. 47, No. 103.

* cited by examiner

YIELD OPTIMIZATION OF PROCESSOR WITH GRAPHENE-BASED TRANSISTORS

CROSS-REFERENCE TO RELATED APPLICATION

The present application is a U.S. national stage filing under 35 U.S.C. §371 of International Application PCT/US2013/055024, filed Aug. 15, 2013 and entitled "YIELD OPTIMIZATION OF PROCESSOR WITH GRAPHENE-BASED TRANSISTORS." The International Application, including any appendices or attachments thereof, is hereby incorporated by reference in its entirety.

BACKGROUND

Unless otherwise indicated herein, the approaches described in this section are not prior art to the claims in this application and are not admitted to be prior art by inclusion in this section.

Graphene is an allotrope of carbon whose structure is a single planar sheet of $sp^2$-bonded carbon atoms that are densely packed in a honeycomb crystal lattice, e.g., a regular hexagonal pattern. Graphene is a semi-metal or zero-gap semiconductor and has remarkably high electron mobility at room temperature. Consequently, there is interest in using graphene for various applications related to integrated circuits. For example, a graphene transistor is a silicon transistor in which the channel of the transistor is formed using graphene. Generally, in a graphene transistor, all other components of the transistor can be substantially similar to the components of a classical complementary metal-oxide semiconductor (CMOS) transistor. Hence, integration of graphene and CMOS transistors in a single processor may be relatively simple and inexpensive. Due to the numerous properties of graphene transistors, including very low delay and switching energy, there is some promising potential for the use of graphene in integrated circuits. However, graphene does also include some drawbacks as well.

SUMMARY

In accordance with at least some embodiments of the present disclosure, a method to select a combination of heterogeneous transistors in an integrated circuit (IC) design comprises identifying a plurality of levels associated with the IC design, wherein each level includes one or more combinatorial elements that comprise transistors formed with a non-graphene semiconductor material and are configured to receive signals from at least one combinatorial element included in an immediately preceding level of the IC design, at least one sequential element, or a combination of both. The method comprises selecting one of the plurality of levels associated with the IC design, replacing combinatorial elements in the selected one of the plurality of levels with combinatorial elements that comprise transistors formed with graphene to form a first configuration, determining an energy leakage rate associated with the first configuration, determining a time delay associated with the first configuration, comparing the determined time delay to a target time delay for the IC design and the determined energy leakage rate to a target energy leakage rate for the IC design, and, in response to the determined energy leakage rate being less than the target energy leakage rate while the determined time delay meets the target time delay, selecting another of the plurality of levels associated with the IC design and replacing combinatorial elements in the another of the plurality of levels with combinatorial elements that comprise transistors formed with graphene to form a second configuration.

In accordance with at least some embodiments of the present disclosure, a method of selecting an optimal combination of heterogeneous transistors in an IC design comprises identifying a plurality of levels associated with the IC design, wherein each level includes one or more combinatorial elements that comprise transistors formed with a non-graphene semiconductor material and are configured to receive signals from at least one combinatorial element included in an immediately preceding level of the IC design, at least one sequential element, or a combination of both. The method further comprises selecting one of the plurality of levels associated with the IC design, replacing combinatorial elements in the selected one of the plurality of levels with combinatorial elements that comprise transistors formed with graphene to form a first configuration, determining an energy leakage rate associated with the first configuration, determining a time delay associated with the first configuration, comparing the determined time delay to a target time delay for the IC design and the determined energy leakage rate to a target energy leakage rate for the IC design, and, in response to the determined time delay being greater than the target time delay while the determined energy leakage rate meets the target energy leakage rate, selecting another of the plurality of levels associated with the IC design and replacing combinatorial elements in the another of the plurality of levels with combinatorial elements that comprise transistors formed with graphene to form a second configuration.

In accordance with at least some embodiments of the present disclosure, an article of manufacture comprises a non-transitory computer-readable medium having computer-executable instructions that, in response to execution by a processor, cause the processor to perform a method to select a combination of heterogeneous transistors in an integrated circuit (IC) design. The method includes identifying a plurality of levels associated with the IC design, wherein each level includes one or more combinatorial elements, selecting one of the plurality of levels associated with the IC design, replacing combinatorial elements in the selected one of the plurality of levels with combinatorial elements that comprise transistors formed with graphene to form a first configuration, determining a performance parameter of the IC design having the first configuration, comparing the determined performance parameter to a target performance parameter for the IC design, and, as a result of the comparing indicating that the target performance parameter permits a further change to the performance parameter of the IC design, selecting another of the plurality of levels associated with the IC design and replacing combinatorial elements in the another of the plurality of levels with combinatorial elements that comprise transistors formed with graphene to form a second configuration.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings:

DETAILED DESCRIPTION

Figure 1:
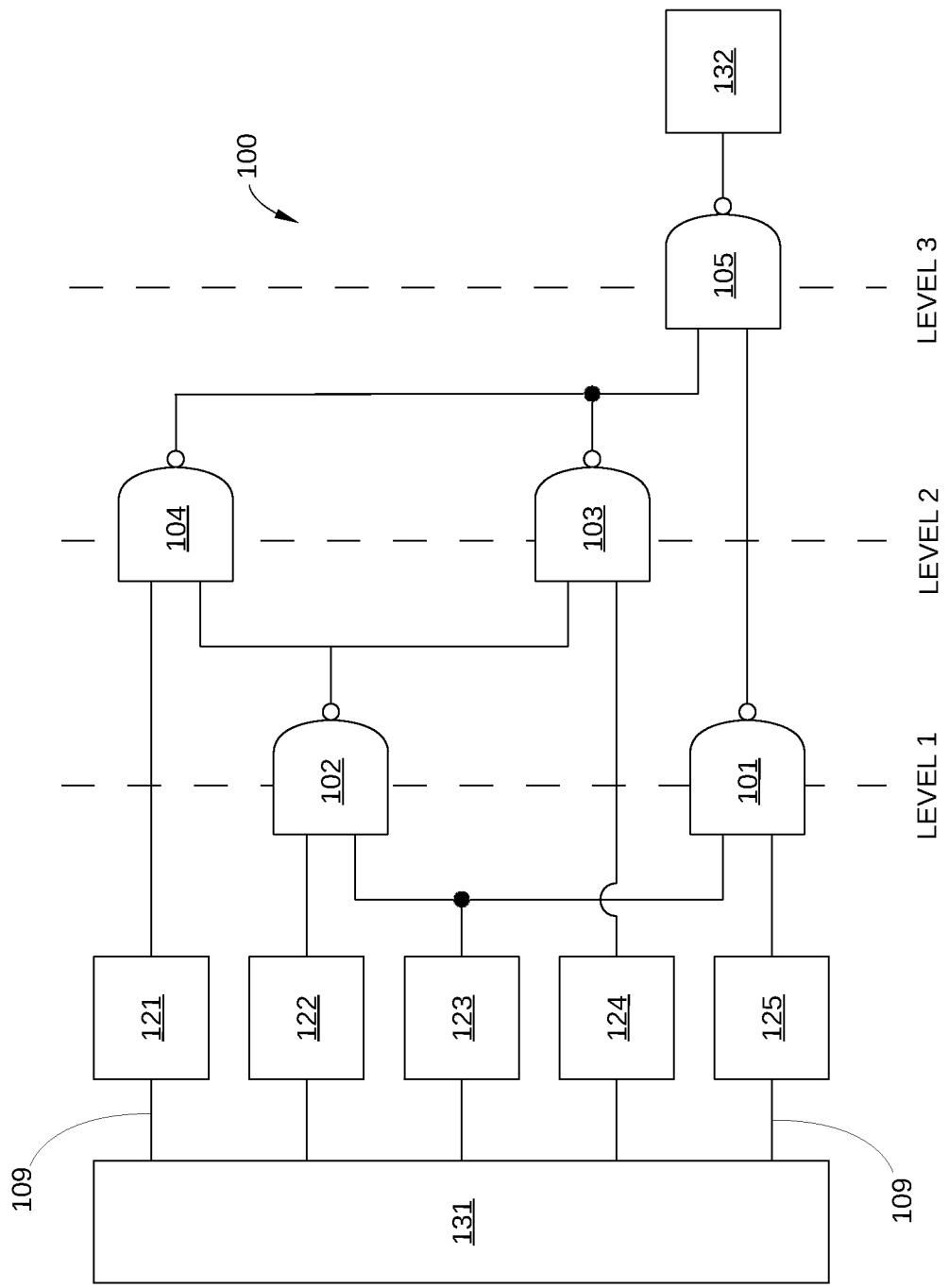
FIG. 1 shows a block diagram of an example integrated circuit (IC) design that may implement some embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. The aspects of the disclosure, as generally described herein, and illustrated in the Figures, can be arranged, substituted, combined, and designed in a wide variety of different configurations, all of which are explicitly contemplated and made part of this disclosure.

Graphene transistors, in which the channel of the transistor is formed using graphene, may be markedly superior to traditional CMOS technology in terms of both greatly reduced delay and switching energy. However, the use of graphene transistors in large-scale integrated circuits may be infeasible due to the high leakage energy associated with such transistors, which has been estimated to be from a few thousand to a few million times greater than equivalent transistors configured with silicon channels. Thus, despite the lower switching energy associated with graphene transistors, the leakage energy of such transistors is such that the overall energy expenditure of an integrated circuit (IC) that includes a graphene transistor may be generally higher than an equivalent IC that instead uses a silicon transistor. Furthermore, the performance of graphene transistors may be generally much more sensitive to process variation that typically occurs in the manufacturing process. This factor can exacerbate difficulties in predicting the performance of graphene transistors prior to fabrication.

Embodiments of the present disclosure include a method to select an optimal or otherwise useful combination of graphene and non-graphene transistors in an IC design. To minimize or otherwise reduce the higher leakage energy caused by graphene transistors, selected non-graphene transistors may be replaced with graphene transistors in the IC design. To limit the number of graphene transistors in the IC design, graphene transistors may replace non-graphene transistors at locations in the IC design where significant delay benefit can be realized.

The method may use a maximally constrained, minimally constraining selection algorithm to strategically select which transistors in a given IC design can be graphene-based to create an IC design that has an optimal or otherwise improved design: either the lowest possible or otherwise reduced delay for a specified energy budget or the lowest or otherwise reduced leakage energy for a specified time delay budget. Thus, a particular IC design may be configured, according to embodiments of the present disclosure, with a number of graphene transistors that may be disposed at selected strategic locations in the IC, this hereinafter being referred to as a specific "configuration" of the IC design. Then, a predicted yield using a relatively small number of process variation instances can be used as a quantifiable metric to determine whether this configuration (e.g., this particular selection of graphene-based transistors) of the IC design is optimal or otherwise provides improvement with respect to other possible configurations. Predicted yield of a configuration may be generally defined as the percentage of ICs, when mass-produced in the configuration of interest, that are predicted to satisfy a specified energy budget or time-delay budget. Predicted yield may be based on transistor-level power and delay models provided herein.

Predicted yield of a configuration of the IC design may be defined in terms one or more metrics, including energy cost (e.g., leakage energy and estimated switching energy) and estimated delay cost and/or other metric(s) or combination thereof. Leakage energy and, to a lesser extent, switching energy may be included as performance metrics for an IC design used in mobile devices, since power conservation can be a design goal for such devices. Delay, e.g., the time for a configuration of the IC design to perform a particular operation or group of operations, may be a metric for an IC design used in a data center or other application in which speed may be a primary performance goal and energy use may be of secondary concern. In addition, delay can be important for some mobile device applications, since delays in processing videos, for example, can be undesirable and disruptive for the end-user of the application. As is discussed in greater detail below, energy cost and delay cost associated with a particular configuration of an IC design may be estimated values that vary based on use of the IC as well as on the many different instances of manufacturing process variation predicted for the configuration.

FIG. 1 shows a block diagram of an example IC design 100 that may implement some embodiments of the present disclosure. IC design 100 may be a design for an IC implemented as a portion of any suitable electronic device or small-form factor portable (or mobile) electronic device such as a cell phone, a personal data assistant (PDA), a personal media player device, a wireless web-watch device, a personal headset device, an application specific device, a hybrid device that includes any of the above functions, or a personal computer, including both laptop computer and non-laptop computer configurations, or other electronic device.

IC design 100 may include gates 101-105, flip-flops 121-125, a source node 131 and a sink node 132. Gates 101-105 and flip-flops 121-125 may be coupled as shown, forming various paths between source node 131 and sink node 132. It is noted that clock inputs, set and reset inputs for flip-flops 121-125, and other components common to a typical IC design are omitted from FIG. 1 for clarity and brevity. It is further noted that IC design 100 can include vastly greater numbers of gates 101-105 and flip-flops 121-125 than illustrated in FIG. 1. For example, in some embodiments, IC design 100 may be a design suitable for an ultra large scale integration (ULSI) logic chip, such as a processor or processor core, having millions of transistors. In some embodiments, there may be fewer components and/or other types of components than those depicted in FIG. 1.

Gates 101-105 may be combinatorial elements, such as transistors, and may each be considered a "node" of the circuit represented by IC design 100 for the purpose of determining the different "levels" of IC design 100, as described below in conjunction with FIG. 2A, FIG. 2B, and FIG. 2C. Flip-flops 121-125 may be sequential elements, such as registers and flip-flops. In some embodiments, flip-flops 121-125 may also be considered nodes when determining levels of the circuit represented by IC design 100, for example when some configurations of IC design 100 include one or more of flip-flops 121-125 that are eligible for being replaced with graphene to optimize or otherwise improve performance of IC design 100. Source node 131 may be coupled to inputs 109 of the circuit represented by IC design 100 and sink node 132 may be coupled to outputs 110 of said circuit. Generally, source node 131 and sink node 132 may be abstract constructs introduced for use in algorithms described herein, and may not represent a physical node of IC design 100 in some embodiments.

Figure 2A:
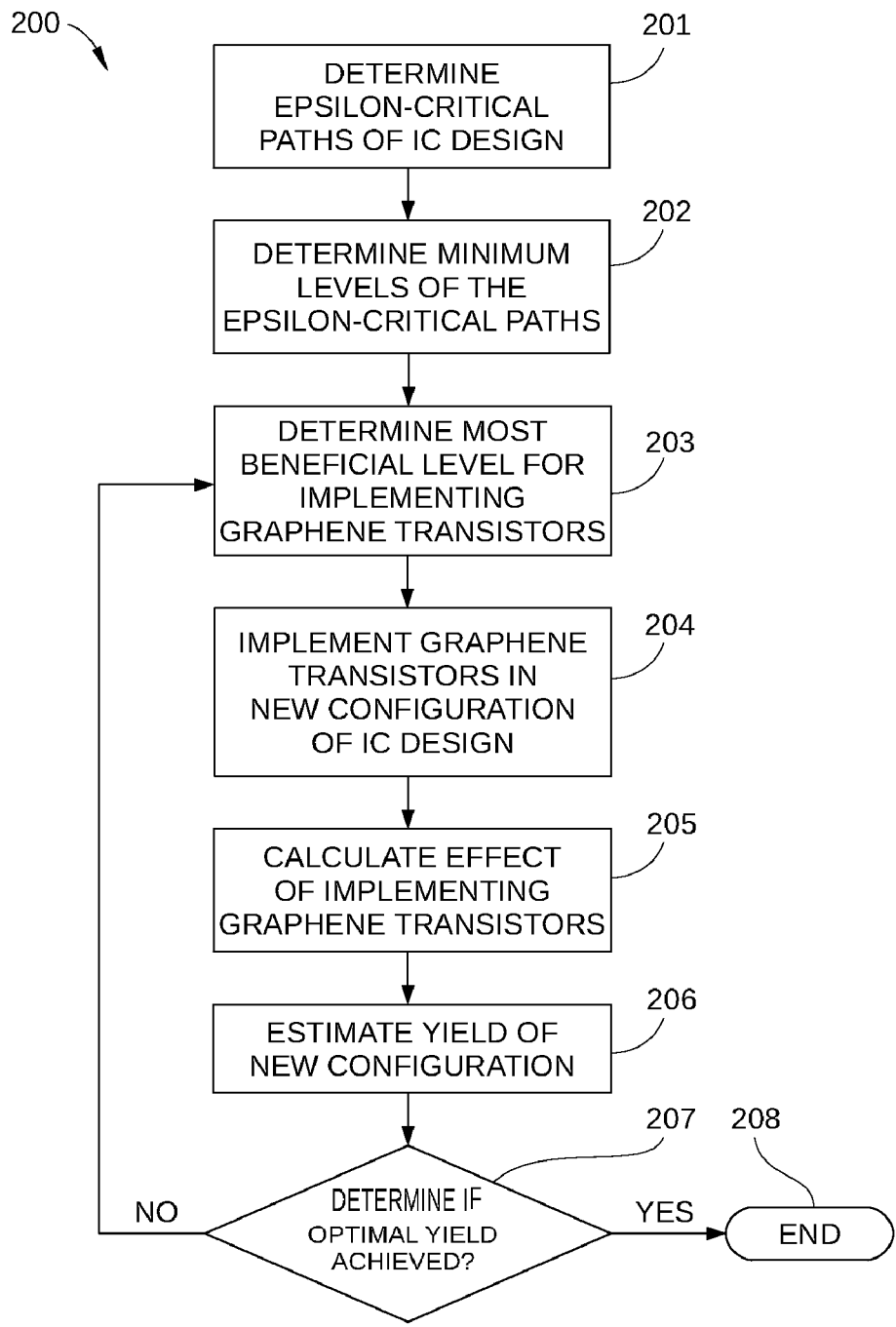
FIG. 2A sets forth a flowchart of an example method to select a combination of heterogeneous (e.g., graphene and non-graphene) transistors in an IC design.

FIG. 2A sets forth a flowchart of an example method 200 to select a combination of heterogeneous (e.g., graphene and non-graphene) transistors in an IC design, according to an embodiment of the disclosure. For example, method 200 may be used to select an optimum or otherwise suitably performing combination of graphene and non-graphene transistors/elements in an IC design, so as to improve the performance of the IC design. Method 200 may include one or more operations, functions or actions as illustrated by one or more of blocks 201, 202, 203, 204, 205, 206, 207 and/or 208. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation. Additional blocks representing other operations, functions or actions may be provided. Although method 200 is described in conjunction with IC design 100 of FIG. 1, performance of method 200 with respect to any suitable IC design is within the scope of the present disclosure.

Method 200 may begin in block 201 "determine epsilon-critical paths of IC design." Block 201 may be followed by block 202 "determine minimum levels of the epsilon-critical paths," block 202 may be followed by block 203 "determine most beneficial level for implementing graphene transistors," block 203 may be followed by block 204 "implement graphene transistors in new configuration of IC design," block 204 may be followed by block 205 "calculate effect of implementing graphene transistors," block 205 may be followed by block 206 "estimate yield of new configuration," block 206 may be followed by block 207 "determine if optimal yield achieved?" and block 207 may be followed by either block 208 "end" or block 203.

In some embodiments, prior to block 201, IC design 100 may be developed to provide a particular functionality. Thus, the specific physical characteristics of the combinatorial and sequential elements of IC design, e.g., gates 101-105 and flip-flops 121-125, may be defined. These physical characteristics may include material properties, such as oxide capacitance and/or other properties, and relevant geometries, such as nominal gate length and gate width and/or other geometries. In addition, operating parameters of IC design 100 may be defined, such as clock frequency, supply voltage, etc.

In block 201, the epsilon-critical delay network of IC design 100 may be determined, which includes the epsilon-critical paths of IC design 100. The epsilon-critical delay network of a circuit may include gates in the circuit that are on at least one path from a source node to a sink node that has delay within a predetermined value (epsilon) of the critical path delay of the circuit, where epsilon is a predetermined value that can be selected based on various criteria. In this way, the importance of each gate in the circuit is abstracted, e.g., quantified, so that the gate can potentially impact delay if in the epsilon-critical delay network. Gates that are not in the epsilon-critical delay network of IC design 100 generally may not have to be considered in subsequent blocks of method 200, thereby greatly reducing the calculations to complete the subsequent blocks.

In block 202, "minimum cuts" or "levels" of IC design 100 may be determined, where each minimum cut intersects all epsilon-critical paths in the IC configuration. To that end, IC design 100 may be formulated as a weighted-directed graph, where each of gates 101-105 may be a node, and there may exist an edge from node i to node j if gate j is a direct output of gate i. A minimum cut of the weighted-directed graph may be one that partitions the graph into two partitions, one containing source node 131 and one containing sink node 132, such that the combined weight of all edges from the source partition to the sink partition is minimized or otherwise reduced. In other words, the removal of all gates from a particular cut results in source node 131 and sink node 132 being disconnected, e.g., having no remaining path therebetween.

Finding a minimum cut of the weighted-directed graph representing IC design 100 may be a nondeterministic polynomial (NP) complete problem, and can be approximated by using the notion of levels. The total number of levels in a circuit may be the number of gates in the path from source node to sink node that contains the largest number of gates. The minimum level of a gate in a circuit may be the smallest number of gates between the gate and the source node, and the maximum level of the gate may be the smallest number of gates between the gate and the sink node. Thus, if a gate receives an input from a level N gate, the level of the receiving gate may be at least level N+1.

In FIG. 1, finding minimum cuts for the weight-directed graph representing the example IC design 100 may involve/include: gates 101 and 102 are on level 1, since each only receives input from flip flops; gates 103 and 104 are on level 2, since gate 103 receives inputs from either a flip flop (flip flop 124) or a level one gate (gate 102) and gate 104 receives inputs from either a flip flop (flip flop 121) or a level one gate (gate 102); and gate 105 is on level 3, since gate 105 receives inputs from either a level one gate (gate 101) or a level 2 gate (gates 103 and 104, respectively). Thus, by formulating a configuration of IC design 100 in which the transistors of any one level of IC design 100 are replaced with graphene transistors, the time delay and switching energy of IC design 100 may be improved as compared to a configuration of IC design 100 in which all transistors are non-graphene transistors. Furthermore, increased leakage energy in IC design 100 can be minimized or otherwise reduced by selecting a level for replacement with graphene transistors that is a "narrow" level, e.g., a level having the fewest gates. In FIG. 1, level 3 is an example of such a level, having a single gate 105.

In more complex embodiments of IC design 100, such as when IC design 100 is configured as a ULSI circuit having millions of transistors, identifying the levels may be more complex, but is a nondeterministic polynomial (NP) complete problem. To make the problem solvable in substantially linear time, valid cuts may be restricted to those that encompass gates that have overlapping levels. In addition, in some embodiments, weighting of the nodes may be used to capture the relevance of each node in terms of one or more particular performance parameters (e.g., circuit delay, leakage energy, and switching energy). Specifically, the weight of a node may be directly proportional or otherwise directly related to the negative leakage impact of the node and inversely proportional or otherwise inversely related to the positive switching impact of the node, where lower-weighted nodes are the possible candidates for being replaced with graphene transistors. Thus, the level that will be selected for being replaced with graphene gates is the level having minimum or otherwise reduced weight, as described above. This level may be selected in block 203.

In block 203, the more beneficial level for implementing graphene transistors may be determined. In block 203, the effect on performance of each of the levels determined in block 202 may be determined when replaced with graphene transistors. Because the performance parameters of interest, e.g., circuit delay, leakage energy, and switching energy, in each gate may be affected significantly by process variation when manufactured, such process variation may generally be taken into account in block 203 when selecting the most beneficial level for implementing graphene transistors.

Process variation may directly impact effective channel length (L) and threshold voltage ($V_{th}$). In some embodiments, the quad-tree model proposed by Cline et al ("Analysis and modeling of CD variation for statistical static timing," IEEE/ACM ICCAD, pp. 60-66, 2006) may be used to reflect the spatial correlation in IC design 100 between proximate gates as well as IC-to-IC variations. The quad-tree model distributes L into multiple levels and allocates grids onto each level, each of which is assigned a value for variation following a normal distribution that captures one source of correlation. The total value of L, then, may be the sum of process variations of the gate over all levels to which the gate belongs, $\Delta L_{ij}$. In this model, described by Equation 1, $\Delta L_{ij}$ is the variation of the i-th level and j-th grid to which the gate belongs, and $\mu_i$ and $\sigma_i$ are parameters of the normal distribution at level i. For gate threshold voltage $V_{th}$, which is not subject to variation, a Gaussian distribution may be assumed.

$$\Delta L = \sum_i \Delta L_{ij}, \text{ where } \Delta L_{ij} \sim N(\mu_i, \sigma_i) \quad (1)$$

Quantitatively determining the most beneficial level for implementing graphene transistors in block 203 is a design optimization/improvement problem with uncertain constraints. In this case, the uncertain constraints may be associated with the very large combinations of different process variation that can occur for each of the gates in a particular level being examined. To approximate the infinite space of variable constraints caused by process variation, a sampling of these constraints may be used. Specifically, for a particular gate being examined, the performance parameters of interest (e.g., circuit delay, leakage energy, and switching energy) can vary over an infinite or otherwise large number of possible combinations, but the gate may be assigned to a "bin" in which gates assigned thereto have performance parameter values in a predetermined range. For example, in an embodiment in which delay, leakage energy, and switching energy are each separated into five discrete bin values for a particular gate configuration, the total number of possible bins for any gate of the configuration may be 125. Thus, there may be a finite distribution of possible versions for each gate that are to be considered in a level of IC design 100 that is eligible for replacement with graphene transistors. Each such bin of performance parameters is referred to herein as a "process variation instance." The likelihood of each process variation instance for a particular gate may be calculated using power and delay models. In some embodiments, the power and delay models expressed by Equations 2-5 may be used in block 203.

$$D = \frac{k_{ip} \cdot C_L \cdot V_{dd}}{2 \cdot n \cdot \mu \cdot C_{ox} \cdot \frac{W}{L} \cdot \left(\frac{kT}{q}\right)^2} \cdot \frac{k_{fit}}{\left[\ln\left(e^{\frac{(1+\sigma)V_{dd}-V_{th}}{2 \cdot n \cdot (kT/q)}}\right) + 1\right]^2} \quad (2)$$

$$C_L = C_{ox} \cdot L \cdot (\gamma \cdot W + W_{fanout}) \quad (3)$$

$$P_{leakage} = 2 \cdot \mu \cdot C_{ox} \cdot \frac{W}{l} \cdot \left(\frac{kT}{q}\right)^2 \cdot V_{dd} \cdot e^{\frac{\sigma \cdot V_{dd}-V_{th}}{n \cdot (kT/q)}} \quad (4)$$

$$P_{switching} = \alpha \cdot C_L \cdot V_{dd}^2 \cdot f \quad (5)$$

In Equations 2-5, $V_{dd}$=supply voltage, n=subthreshold slope, $\mu$=mobility, $C_{ox}$=oxide capacitance, W=gate width, L=gate length, thermal voltage $\phi_t$=(kT/q), $\sigma$=DIBL factor, $V_{th}$=threshold voltage, $k_{tp}$=a delay parameter, and $k_f$=a model fitting parameter. Load capacitance $C_L$ is defined in Equation 2, where $\gamma$ is the logical effort of the gate and $W_{fanout}$ is the sum of the widths of the load gates.

In determining the most beneficial level (or otherwise improved level) in IC design 100 to replace with graphene transistors, the objective junction for each level being considered in block 203 may be based on, for each gate in the level that is not already graphene and is in the epsilon-critical network of IC design, a ratio of a leak factor times the energy leakage of the gate and a switch factor times the switch energy of the gate. By minimizing or otherwise reducing the objective function, the most beneficial level (or otherwise improved level) in IC design 100 for replacement with graphene transistors can be determined. It is noted that the objective function can be minimized/reduced in terms of different goals, as appropriate. For example, in some embodiments, the objective function can be used to minimize or otherwise reduce time delay for a specified maximum energy budget, so that the fastest configuration of IC design 100 that still satisfies this energy budget may be ultimately selected by method 200. Alternatively, the objective function can be used to minimize or otherwise reduce the energy-delay product for a specified maximum delay constraint, so that the most energy efficient configuration of IC design 100 that still satisfies said maximum delay constraint may be ultimately selected by method 200.

In block 204, graphene transistors may be implemented in IC design 100 by replacing all transistors in the level of IC design 100 selected for replacement with graphene in block 203.

In block 205, the effect of implementing graphene transistors in the selected level of IC design 100 may be calculated. Specifically, the delay, leakage energy, and switching energy and/or other parameters may be calculated for the configuration of IC design 100 implemented in block 204. Power and delay models, such as the power and delay models expressed by Equations 2-5, may be used to quantify these values. The impact of using graphene transistors to implement a gate in IC design 100 can be approximated using scaling factors representing the behavior of graphene transistors relative to non-graphene transistors. For example, for delay, a typical scaling factor of 0.05 may be used; for leakage power, a typical scaling factor of 1000 may be used; and for switching power, a typical scaling factor of 0.2 may be used. In other words, implementing a gate using graphene may reduce delay associated with the gate by about 20×, increase leakage power associated with the gate by about 1000×, and reduce switching power associated with the gate by about 5×.

Generally, the delay, leakage energy, and switching energy and/or other parameters may be calculated for all process variation instances of the configuration of IC design 100 under consideration. Thus, a single value for delay, leakage energy, and switching energy, etc. may not be generated in block 205. Instead, based on predicted manufacturing process variation of ICs fabricated with the configuration, a distribution of these parameters may be generated for the configuration of IC design 100 under consideration. Consequently, some, all, or none of the process variation instances in distribution determined in block 205 may satisfy a particular performance parameter, such as time delay or leakage energy.

In block 206, yield for the configuration of IC design 100 implemented in block 204 may be calculated, where yield may include the percentage of IC chips estimated to satisfy a particular performance goal when the configuration of interest is manufactured. Such an estimate may be statistically based on manufacturing process variation and the effects thereof on the performance of a population of ICs manufactured with the configuration of IC design 100 implemented in block 204. Consequently, in block 206, predicted performance of manufactured IC chips (e.g., delay, leakage energy, switching energy, and/or an energy-delay product or other) may be calculated for all process variation instances of the configuration of interest and compared to a specified speed and/or energy goal.

In block 207, a determination may be made whether an optimal or otherwise improved implementation of IC design 100 has been found, e.g., has the specified speed and/or leakage energy goal been achieved by a satisfactory percentage (yield) of the possible process variation instances of the configuration implemented in block 204. If the determination is made that the configuration of IC design 100 implemented in block 204 is an optimal or otherwise best available implementation, method 200 proceeds to block 208 and ends. If the determination is made that the configuration implemented in block 205 is not an optimal or otherwise best available implementation, method 200 proceeds back to block 203, and blocks 203-207 are repeated.

In some embodiments, an optimal/improved implementation of IC design 100 may include a configuration of IC design 100 that has a predicted yield in block 206 that is greater than a minimum desired yield or other threshold. In other embodiments, an optimal/improved implementation of IC design 100 may include a configuration of IC design 100 that meets or exceeds a particular performance goal while using substantially all of a specified performance parameter budget. For example, given a specified energy budget and a delay-based performance goal for IC design 100 (e.g., attaining the greatest speed possible without exceeding the energy budget), an optimal/improved implementation may be a configuration of IC design 100 that uses substantially all of the specified energy budget, has no more than a maximum allowable delay, and has satisfactory yield. Because the configuration uses substantially all of the specified energy budget, an additional level of IC design 100 possibly cannot be replaced with graphene transistors without exceeding the energy budget. Hence, such a configuration may be the optimal or best available implementation of IC design 100 under the circumstances.

Thus, given a specific IC design and performance goals, a determination can be made whether certain gates of the IC design should be or can be implemented using graphene transistors. A limited number of process variation instances may be used that follow a process variation model, a power model, and a delay model and/or other model(s), to facilitate solution of the problem when the IC design includes a very large number of gates. Furthermore, a predicted yield, e.g., percentage of the predicted process variation instances of the IC design, can be maximized or otherwise increased under delay and power constraints. The number of process variation instances in some embodiments may be assumed to be a large number, on the order of millions, which is a large enough sample set to cover the entire process variation (PV) model.

Figure 2B:
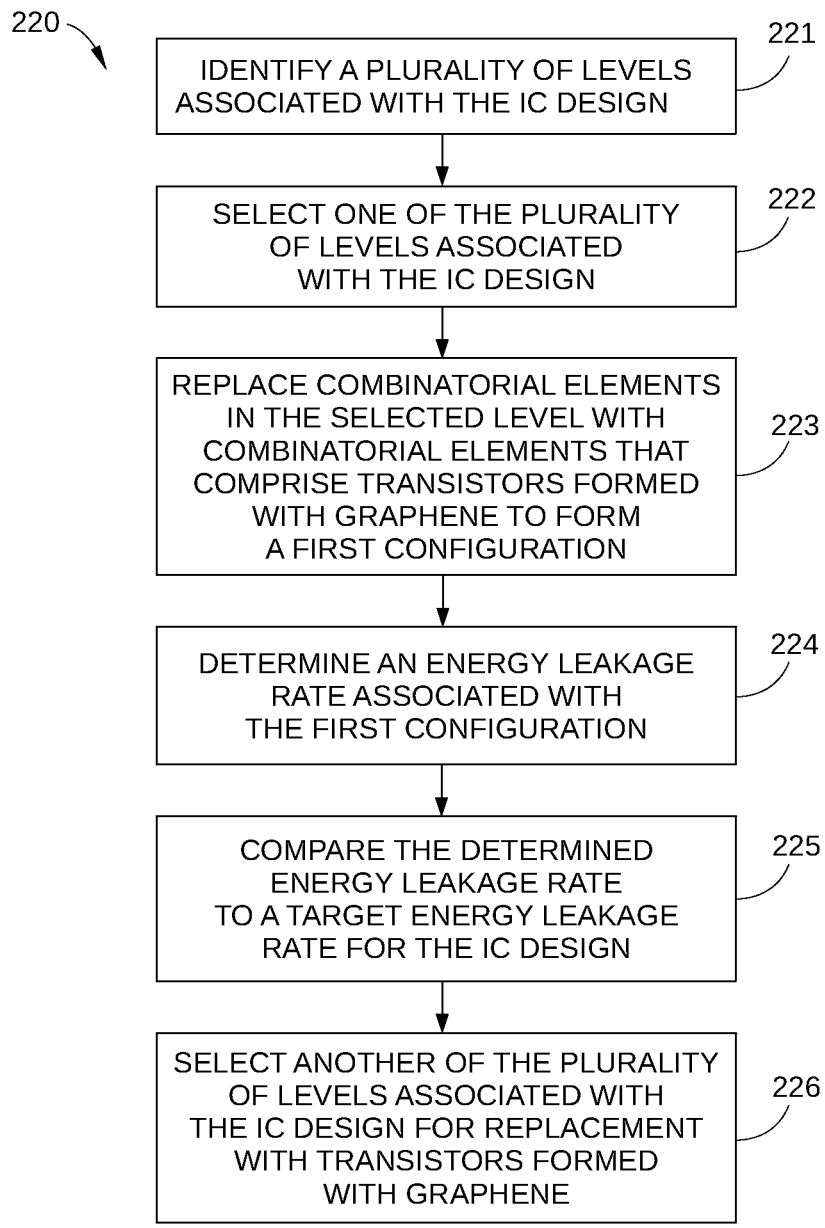
FIG. 2B sets forth a flowchart of an example method to select a combination of heterogeneous (e.g., graphene and non-graphene) transistors in an IC design.

FIG. 2B sets forth a flowchart of an example method 220 to select a combination of heterogeneous transistors in an integrated circuit (IC) design, according to an embodiment of the disclosure. For example, method 220 may be used to select an optimum or otherwise suitably performing combination of graphene and non-graphene transistors/elements in an IC design, so as to improve the performance of the IC design. Method 220 may include one or more operations, functions or actions as illustrated by one or more of blocks 221, 222, 223, 224, 225, and/or 226. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation. Additional blocks representing other operations, functions or actions may be provided. Although method 220 is described in conjunction with IC design 100 of FIG. 1, performance of method 220 with respect to any suitable IC design is within the scope of the present disclosure.

Method 220 may begin in block 221 "identify a plurality of levels associated with the IC design." Block 221 may be followed by block 222 "select one of the plurality of levels associated with the IC design," block 222 may be followed by block 223 "replace combinatorial elements in the selected level with combinatorial elements that comprise transistors formed with graphene to form a first configuration," block 223 may be followed by block 224 "determine an energy leakage rate associated with the first configuration," block 224 may be followed by block 225 "compare the determined energy leakage rate to a target energy leakage rate for the IC design," and block 225 may be followed by block 226 "select another of the plurality of levels associated with the IC design for replacement with transistors formed with graphene."

In block 221, a plurality of levels associated with the IC design are identified, wherein each level includes one or more combinatorial elements that comprise transistors formed with a non-graphene semiconductor material. Each level is configured to receive signals from at least one combinatorial element included in a lower level of the IC design, at least one sequential element, or a combination of both.

In block 222, one of the plurality of levels associated with the IC design is selected. In some embodiments, the selected level is a "narrow" level that has fewer gates than other levels in the IC design.

In block 223, combinatorial elements in the level selected in block 222 are replaced with combinatorial elements that comprise transistors formed with graphene to form a first configuration.

In block 224, an energy leakage rate is determined that is associated with the first configuration. For example, in some embodiments, an energy leakage rate for each combinatorial element replaced with graphene in the first configuration may be updated so that a total energy leakage rate for the entire first configuration may be determined.

In block 225, the determined energy leakage rate is compared to a target energy leakage rate for the IC design.

In block 226, in response to the determined energy leakage rate in block 225 being less than the target energy leakage rate, selecting another of the plurality of levels associated with the IC design for replacement with combinatorial elements that comprise transistors formed with graphene to form a second configuration.

Figure 2C:
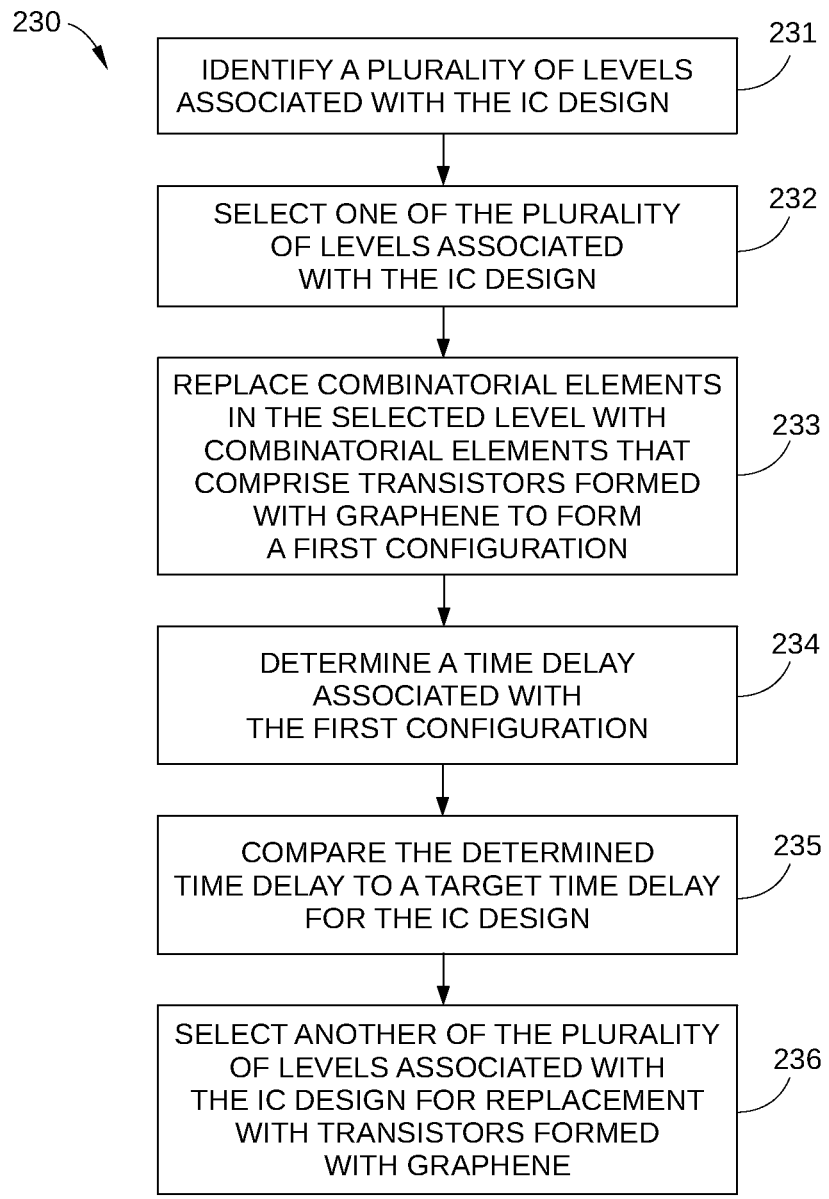
FIG. 2C sets forth a flowchart of an example method to select a combination of heterogeneous (e.g., graphene and non-graphene) transistors in an IC design.

FIG. 2C sets forth a flowchart of an example method 230 to select a combination of heterogeneous transistors in an integrated circuit (IC) design, according to an embodiment of the disclosure. For example, method 230 may be used to select an optimum or otherwise suitably performing combination of graphene and non-graphene transistors/elements in an IC design, so as to improve the performance of the IC design. Method 230 may include one or more operations, functions or actions as illustrated by one or more of blocks 231, 232, 233, 234, 235, and/or 236. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation. Additional blocks representing other operations, functions or actions may be provided. Although method 230 is described in conjunction with IC design 100 of FIG. 1, performance of method 230 with respect to any suitable IC design is within the scope of the present disclosure.

Method 230 may begin in block 231 "identify a plurality of levels associated with the IC design." Block 231 may be followed by block 232 "select one of the plurality of levels associated with the IC design," block 232 may be followed by block 233 "replace combinatorial elements in the selected level with combinatorial elements that comprise transistors formed with graphene to form a first configuration," block 233 may be followed by block 234 "determine a time delay associated with the first configuration," block 234 may be followed by block 235 "compare the determined time delay to a target time delay for the IC design," and block 235 may be followed by block 236 "select another of the plurality of levels associated with the IC design for replacement with transistors formed with graphene."

Blocks 231-233 may be substantially similar to blocks 221-223, respectively, in method 220.

In block 234, a time delay is determined that is associated with the first configuration, where the time delay may correspond to a duration of a clock cycle. In some embodiments, the time delay in block 234 is determined by calculating a time delay for each individual combinatorial element in the level selected in block 232 that are replaced with graphene to form the first configuration.

In block 235, the determined time delay is compared to a target time delay for the IC design.

In block 236, in response to the determined time delay in block 235 being less than the target time delay, selecting another of the plurality of levels associated with the IC design for replacement with combinatorial elements that comprise transistors formed with graphene to form a second configuration.

Figure 3:
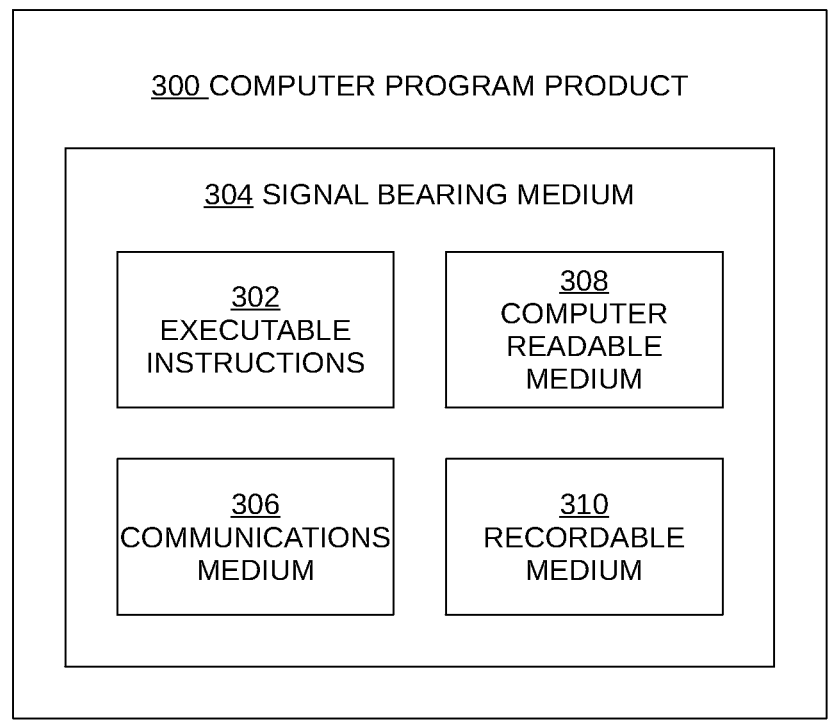
FIG. 3 is a block diagram of an illustrative embodiment of a computer program product to implement a method to select a combination of graphene and non-graphene transistors in an IC.

FIG. 3 is a block diagram of an illustrative embodiment of a computer program product 300 to implement a method to select a combination of heterogeneous transistors in an IC design. Computer program product 300 may include a signal bearing medium 304. Signal bearing medium 304 may include one or more sets of executable instructions 302 that, when executed by, for example, a processor of a computing device, may provide at least the functionality described above with respect to the preceding figures.

In some implementations, signal bearing medium 304 may encompass a non-transitory computer readable medium 308, such as, but not limited to, a hard disk drive, a Compact Disc (CD), a Digital Video Disk (DVD), a digital tape, memory, etc. In some implementations, signal bearing medium 304 may encompass a recordable medium 310, such as, but not limited to, memory, read/write (R/W) CDs, R/W DVDs, etc. In some implementations, signal bearing medium 304 may encompass a communications medium 306, such as, but not limited to, a digital and/or an analog communication medium (e.g., a fiber optic cable, a waveguide, a wired communications link, a wireless communication link, etc.). Computer program product 300 may be recorded on non-transitory computer readable medium 308 or another similar recordable medium 310.

Figure 4:
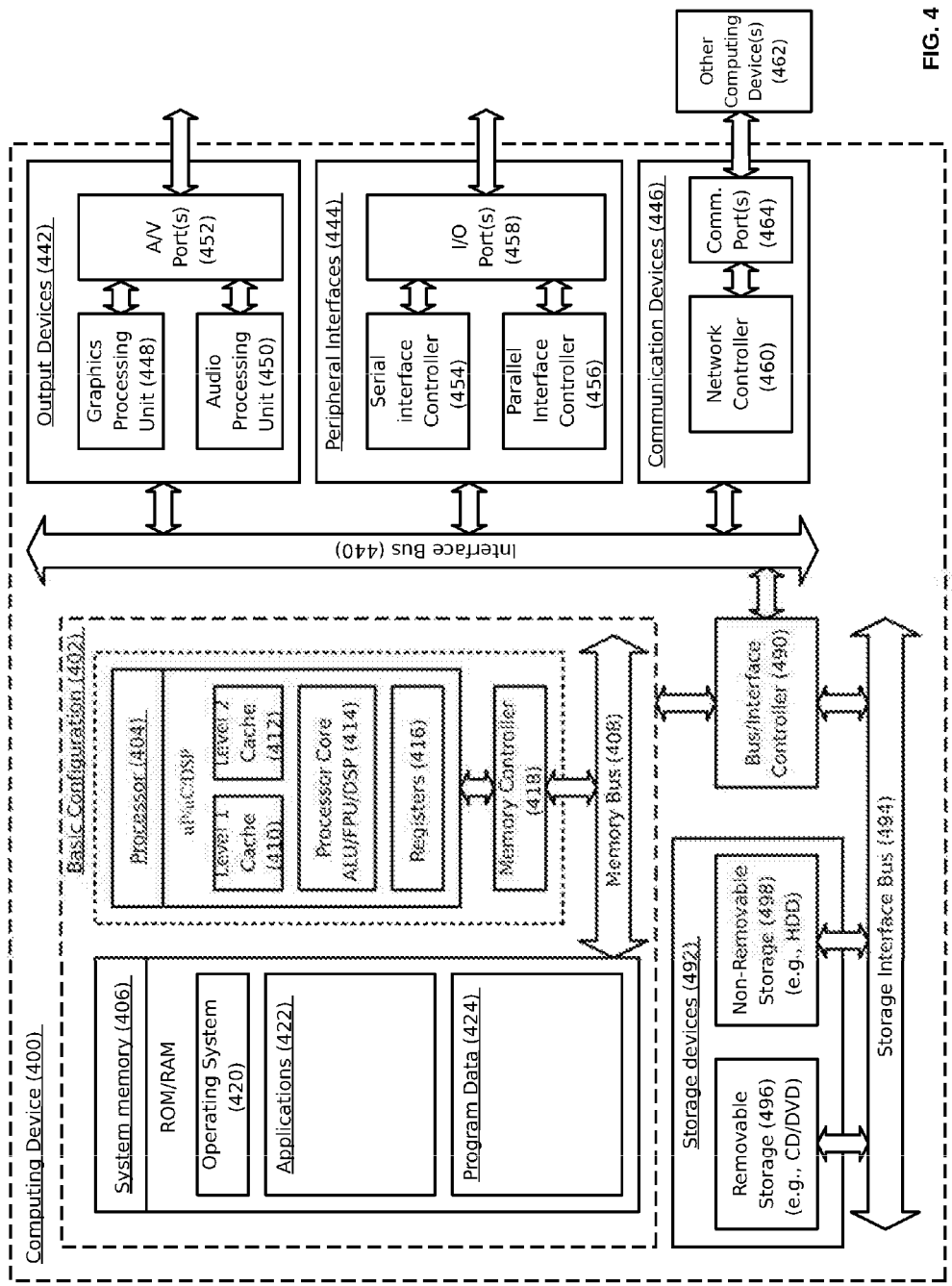
FIG. 4 is a block diagram illustrating an example computing device that is arranged to select a combination of graphene and non-graphene transistors in an IC design, all arranged in accordance with some embodiments of the present disclosure.

FIG. 4 is a block diagram illustrating an example computing device 400 that is arranged to select a combination of graphene and non-graphene transistors in an IC design, in accordance with at least some embodiments of the present disclosure. In some embodiments, some components/parts of the computing device 400 may themselves be implemented using the combination of graphene and non-graphene elements as described above. In a very basic configuration 402, computing device 400 typically includes one or more processors 404 and a system memory 406. A memory bus 408 may be used for communicating between processor 404 and system memory 406.

Depending on the desired configuration, processor 404 may be of any type including but not limited to a microprocessor (µP), a microcontroller (µC), a digital signal processor (DSP), or any combination thereof. Processor 404 may include one more levels of caching, such as a level one cache 410 and a level two cache 412, a processor core 414, and registers 416. An example processor core 414 may include an arithmetic logic unit (ALU), a floating point unit (FPU), a digital signal processing core (DSP Core), or any combination thereof. Processor 404 may include programmable logic circuits, such as, without limitation, field-programmable gate arrays (FPGAs), patchable application-specific integrated circuits (ASICs), complex programmable logic devices (CPLDs), and others. An example memory controller 418 may also be used with processor 404, or in some implementations memory controller 418 may be an internal part of processor 404.

Depending on the desired configuration, system memory 406 may be of any type including but not limited to volatile memory (such as RAM), non-volatile memory (such as ROM, flash memory, etc.) or any combination thereof. System memory 406 may include an operating system 420, one or more applications 422, and program data 424. Application 422 may include one or more applications separated into blocks, as described above in conjunction with one or more of the figure(s). Program data 424 may include data that may be useful for operation of computing device 400. In some embodiments, application 422 may be arranged to operate with program data 424 on operating system 420. This described basic configuration 402 is illustrated in FIG. 4 by those components within the inner dashed line.

Computing device 400 may have additional features or functionality, and additional interfaces to facilitate communications between basic configuration 402 and any required devices and interfaces. For example, a bus/interface controller 490 may be used to facilitate communications between basic configuration 402 and one or more data storage devices 492 via a storage interface bus 494. Data storage devices 492 may be removable storage devices 496, non-removable storage devices 498, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

System memory 406, removable storage devices 496 and non-removable storage devices 498 are examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communication devices 446) to basic configuration 402 via bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc.) or other peripheral devices (e.g., printer, scanner, etc.) via one or more I/O ports 458. An example communication device 446 includes a network controller 460, which may be arranged to facilitate communications with one or more other computing devices 462 over a network communication link, such as, without limitation, optical fiber, Long Term Evolution (LTE), 3G, WiMax, via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 400 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 400 may also be implemented as a personal computer including both laptop computer and non-laptop computer configurations. Embodiments of the present disclosure include a method to select a combination of graphene and non-graphene transistors in an IC design. Thus, a particular IC design can be improved with the strategic placement of graphene transistors while minimizing or otherwise reducing the undesirable effects of high leakage energy associated with graphene transistors.

There is little distinction left between hardware and software implementations of embodiments of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A method to select a combination of heterogeneous transistors in an integrated circuit (IC) design, the method comprising:

identifying, by a computing device, a plurality of levels associated with the IC design, wherein each level includes one or more combinatorial elements that comprise transistors formed with a non-graphene semiconductor material and are configured to receive signals from at least one combinatorial element included in an immediately preceding level of the IC design, at least one sequential element, or a combination of both;

selecting, by the computing device, one of the plurality of levels associated with the IC design;

replacing, by the computing device, combinatorial elements in the selected one of the plurality of levels with combinatorial elements that comprise transistors formed with graphene to form a first configuration;

determining, by the computing device, an energy leakage rate associated with the first configuration;

determining, by the computing device, a time delay associated with the first configuration;

comparing, by the computing device, the determined time delay to a target time delay for the IC design and the determined energy leakage rate to a target energy leakage rate for the IC design; and in response to the determined energy leakage rate being less than the target energy leakage rate while the determined time delay meets the target time delay, selecting, by the computing device, another of the plurality of levels associated with the IC design and replacing combinatorial elements in the another of the plurality of levels with combinatorial elements that comprise transistors formed with graphene to form a second configuration, wherein each of the combinatorial elements that comprise transistors formed with graphene has a shorter time delay and a greater energy leakage rate than the respective combinatorial element being replaced.

2. The method of claim 1, wherein determining the energy leakage rate comprises determining an energy leakage rate for a plurality of process variation instances of the IC design.

3. The method of claim 2, further comprising determining, by the computing device, a yield for the first configuration based on the energy leakage rate determined for the plurality of process variation instances of the IC design and on the target energy leakage rate for the IC design.

4. The method of claim 3, wherein determining the yield for the first configuration is based on a process variation of effective channel length and a threshold voltage of combinatorial elements in the IC design.

5. The method of claim 3, wherein determining the yield of the first configuration is based on at least one of a gate-level delay model, a gate-level leakage power model, and a gate-level switching power model.

6. The method of claim 1, wherein replacing combinatorial elements in the selected one of the plurality of levels comprises replacing each and every combinatorial element in the selected one of the plurality of levels with a combinatorial element that comprises a transistor formed with graphene to form the first configuration.

7. The method of claim 1, wherein selecting one of the plurality of levels associated with the IC design comprises weighting at least one node in the IC design directly proportional to a negative leakage impact of the node and inversely proportional to a positive switching impact of the node.

8. The method of claim 1, further comprising, prior to identifying the plurality of levels, determining, by the computing device, epsilon-critical paths from a source node to a sink node of the IC design that have delay greater than or equal to epsilon (c) times the critical path delay of the IC design.

9. The method of claim 1, wherein selecting one of the plurality of levels associated with the IC design comprises reducing an objective function with respect to at least one of a time delay cost associated with the IC design, an energy cost associated with the IC design, and a time-delay product associated with the IC design.

10. A method to select a combination of heterogeneous transistors in an integrated circuit (IC) design, the method comprising:

identifying, by a computing device, a plurality of levels associated with the IC design, wherein each level includes one or more combinatorial elements that comprise transistors formed with a non-graphene semiconductor material and are configured to receive signals from at least one combinatorial element included in an immediately preceding level of the IC design, at least one sequential element, or a combination of both;

selecting, by the computing device, one of the plurality of levels associated with the IC design;

replacing, by the computing device, combinatorial elements in the selected one of the plurality of levels with combinatorial elements that comprise transistors formed with graphene to form a first configuration;

determining, by the computing device, an energy leakage rate associated with the first configuration;

determining, by the computing device, a time delay associated with the first configuration;

comparing, by the computing device, the determined time delay to a target time delay for the IC design and the determined energy leakage rate to a target energy leakage rate for the IC design; and in response to the determined time delay being greater than the target time delay while the determined energy leakage rate meets the target energy leakage rate, selecting, by the computing device, another of the plurality of levels associated with the IC design and replacing combinatorial elements in the another of the plurality of levels with combinatorial elements that comprise transistors formed with graphene to form a second configuration.

11. The method of claim 10, wherein determining the time delay comprises determining a time delay for a plurality of process variation instances of the IC design.

12. The method of claim 11, further comprising determining, by the computing device, a yield for the first configuration based on the time delay determined for the plurality of process variation instances of the IC design and on the target time delay for the IC design.

13. The method of claim 12, wherein determining the yield for the first configuration is based on a process variation of effective channel length and a threshold voltage of combinatorial elements in the IC design.

14. The method of claim 12, wherein determining the yield of the first configuration is based on at least one of a gate-level delay model, a gate-level leakage power model, and a gate-level switching power model.

15. The method of claim 10, wherein replacing combinatorial elements in the selected one of the plurality of levels comprises replacing each and every combinatorial element in the selected one of the plurality of levels with a combinatorial element that comprises a transistor formed with graphene to form the first configuration.

16. The method of claim 10, wherein selecting one of the plurality of levels associated with the IC design comprises weighting at least one node in the IC design directly proportional to a negative leakage impact of the node and inversely proportional to a positive switching impact of the node.

17. The method of claim 10, further comprising, prior to identifying the plurality of levels, determining, by the computing device, epsilon-critical paths associated with the IC design having a time delay that is greater than the target time delay.

18. The method of claim 10, wherein selecting one of the plurality of levels associated with the IC design comprises reducing an objective function with respect to at least one of a time delay cost associated with the IC design, an energy cost associated with the IC design, and a time-delay product associated with the IC design.

19. An article of manufacture, comprising:
a non-transitory computer-readable medium having computer-executable instructions that, in response to execution by a processor, cause the processor to perform a method to select a combination of heterogeneous transistors in an integrated circuit (IC) design, the method including:

identifying a plurality of levels associated with the IC design, wherein each level includes one or more combinatorial elements;

selecting one of the plurality of levels associated with the IC design;

replacing combinatorial elements in the selected one of the plurality of levels with combinatorial elements that comprise transistors formed with graphene to form a first configuration;

determining a performance parameter of the IC design having the first configuration;

comparing the determined performance parameter to a target performance parameter for the IC design; and as a result of the comparing indicating that the target performance parameter permits a further change to the performance parameter of the IC design, selecting another of the plurality of levels associated with the IC design and replacing combinatorial elements in the another of the plurality of levels with combinatorial elements that comprise transistors formed with graphene to form a second configuration.

20. The article of manufacture of claim 19, wherein the determined performance parameter and the target performance parameter both pertain to an energy leakage rate for the IC design.

21. The article of manufacture of claim 19, wherein the determined performance parameter and the target performance parameter both pertain to time delay for the IC design.

22. The article of manufacture of claim 19, wherein replacing the combinatorial elements to form either or both the first and second configurations include replacing some of the combinatorial elements with the transistors formed with graphene while keeping other combinatorial elements with transistors formed without graphene.

* * * * *